United States Patent

Hill et al.

[11] Patent Number: 6,159,816
[45] Date of Patent: Dec. 12, 2000

[54] METHOD OF FABRICATING A BIPOLAR TRANSISTOR

[75] Inventors: Darrell G. Hill, Plano; Timothy S. Henderson, Richardson; William U. Liu, Plano; Shou-Kong Fan, Richardson; Hin-Fai Chau, Plano; Damian Costa, Dallas; Ali Khatibzadeh, Plano, all of Tex.

[73] Assignee: TriQuint Semiconductor Texas, Inc., Hillsboro, Oreg.

[21] Appl. No.: 08/482,034

[22] Filed: Jun. 7, 1995

Related U.S. Application Data

[62] Division of application No. 08/287,567, Aug. 9, 1994, abandoned.

[51] Int. Cl.[7] .................................................. H01L 21/331
[52] U.S. Cl. .......................................... 438/309; 438/312
[58] Field of Search .................................. 438/309, 312, 438/350, 320

[56] References Cited

U.S. PATENT DOCUMENTS

| | | | |
|---|---|---|---|
| 5,284,783 | 2/1994 | Ishikawa et al. | 437/133 |
| 5,330,932 | 7/1994 | Liu et al. | 437/909 |
| 5,411,632 | 5/1995 | Delage et al. | 156/652.1 |
| 5,420,052 | 5/1995 | Morris et al. | 437/133 |
| 5,429,957 | 7/1995 | Matsuno et al. | 437/128 |

FOREIGN PATENT DOCUMENTS

| | | |
|---|---|---|
| 0384113 | 8/1990 | European Pat. Off. . |
| 0245958 | 10/1988 | Japan . |
| 0138949 | 6/1991 | Japan .................................. 257/198 |

OTHER PUBLICATIONS

Malik, et al., "Submicron Scaling of AlGaAs/GaAs Self-Aligned Thin Emitter Heterojunction Bipolar Transistors (SATE–HBT) with Current Gain Independent of Emitter Area," *Electronics Letters*, vol. 25, No. 17, Aug. 17, 1989, pp. 1175–1177.

Tiwari, et al., "Surface Recombination in GaAlAs/GaAs Heterostructure Bipolar Transistors," *J. Appl. Phys.*, vol. 64, No. 10, Nov. 15, 1988, pp. 5009–5013.

Nakajima, et al., "Emitter–Base Junction Size Effect on Current Gain $H_{fe}$ of AlGaAs/GaAs Heterojunction Bipolar Transistors," *Japanese Journal of Applied Physics*, vol. 24, No. 8, Aug., 1985, pp. L596–L598.

*Primary Examiner*—Tuan H. Nguyen
*Attorney, Agent, or Firm*—Skjerven Morrill MacPherson LLP; Brian D. Ogonowsky; Daniel P. Stewart

[57] ABSTRACT

A bipolar transistor includes a passivating layer of material 40 in the base structure 42 that serves to cover the extrinsic base region of the transistor. The passivating layer 40 is formed of a material having a wider bandgap than the base layer 44, and is heavily doped with the same doping type (n or p) as the base layer. The invention is advantageous in that the base contacts 48 of the device are made directly to the passivating layer 40 and are not in direct contact with the base layer 44. This eliminates the need for alloyed contacts and the concomitant reliability problems associated with spiking contacts. In addition, the invention is completely compatible with self-aligned production techniques.

7 Claims, 6 Drawing Sheets

METHOD OF FABRICATING A BIPOLAR TRANSISTOR

This is a divisional of application Ser. No. 08/287,567, filed Aug. 9, 1994, now abandoned.

FIELD OF THE INVENTION

This invention generally relates to semiconductor electronic devices, and more specifically to heterojunction bipolar transistors having improved current gain and reliability.

BACKGROUND OF THE INVENTION

Heterojunction bipolar transistors (HBTs) exhibit desirable features such as high current gain and an extremely high cut-off frequency for switching applications, and high power gain and power density for microwave amplifier applications. Even so, as with other types of semiconductor devices there is demand for ever higher operating frequencies or switching speeds from HBTs. Efforts to accomplish this increased performance invariably lead to a scaling down of transistor size. However, as the emitter in an HBT is scaled down, the current gain of the transistor is also dramatically reduced. This effect threatens to limit the level of integration and circuit complexity that can be realized with HBT technology, and has implications for the reliability of HBT power transistors as well.

The reduction in current gain is related to the ratio of the HBT's emitter perimeter-to-area ratio. A cross-sectional diagram of a typical npn HBT is shown in FIG. 1 (the base layer thickness relative to the other layers is highly exaggerated). In operation, a flow of electrons is established from the emitter, through the base, and into the collector. This electron current is modulated by holes injected into the base from the base contacts. These holes recombine with some of the electrons from the emitter and therefore result in finite current gain. One limitation on current gain is the high density of carrier traps which exists at an exposed semiconductor surface. The trap density is typically large enough to create an electric field near the surface that extends some distance into the base layer. Electrons injected near the edge of the emitter mesa are drawn to the surface of the base layer by this electric field where they recombine in the abundance of traps present at the surface. Hence, the total minority carrier current from the emitter has a desirable component, i.e. the carriers that transit the base to the collector; and an undesirable component, i.e. the carriers that recombine at the surface of the base layer. Unfortunately, the desirable current scales with the area of the emitter, while the undesirable current scales with the perimeter. Consequently, as the emitter dimensions are reduced, the perimeter current becomes a larger percentage of the total emitter current. This results in a decrease of the current gain of the transistor.

Past efforts at solving the problem of surface recombination at the extrinsic base surface have included physical and chemical passivation treatments. Sputtered SiN, depleted AlGaAs passivation ledges, and sulfide-base coatings have been reported. See O. Nakajima, et al., "Emitter-Base Junction Size Effect on Current Gain $H_{fe}$ of AlGaAs/GaAs Heterojunction Bipolar Transistors", *Japanese Journal of Applied Physics*, Vol. 24, No. 8, pp. L596–L598, August 1985; R. J. Malik, et al., "Submicron Scaling of AlGaAs/GaAs Self-aligned Thin Emitter Heterojunction Bipolar Transistors with Current Gain Independent of Emitter Area", *Electronics Letters*, Vol. 25, No. 17, pp. 1175–1177, Aug. 17, 1989; S. Tiwari, et al., "Surface Recombination in AlGaAs/GaAs Heterostructure Bipolar Transistors", *Journal of Applied Physics*, Vol. 64, No. 10, pp. 5009–5012, Nov. 15, 1988. However, these solutions have drawbacks such as process complexity and performance shortcomings that prevent them from offering a complete answer to the problem of extrinsic base surface recombination. For example, depleted AlGaAs passivation ledges, shown in FIG. 2, while effective in reducing the effects of surface states, require that the spacing between the base contact 10 and the active emitter 12 be large enough to accommodate a passivation ledge 14 extending between the active emitter 12 and the base contact 10. High frequency operation demands a lower base resistance and base-collector junction capacitance than is generally possible with such a technique. In addition, the passivation ledge structure does not lend itself to the self-aligned fabrication techniques necessary for economical volume production.

Another prior art approach to passivating the base surface is shown in FIG. 3 and is described in Malik, supra at 1176. It is a modification of the ledge passivation approach. The surface of the GaAs base layer 20 is completely covered by a thin AlGaAs emitter layer 22, in contrast to the ledge structure described above. As in the ledge approach the thin AlGaAs layer 22 extending between the emitter mesa 24 and the base contacts 26 is fully depleted. It serves to passivate the surface states at the surface of the base layer and therefore minimizes surface recombination. In this particular prior art structure, the base layer is primarily GaAs, but contains a small mole fraction of aluminum. The aluminum content is graded from 0% at the base-collector interface to 6% at the base-emitter interface. This sets up a quasi-electric field that helps to keep the minority carriers from migrating to the surface to recombine. However, a problem with this approach is that the base contacts are formed on the emitter layer. Metal from the contacts spikes through the emitter layer and into the base layer upon being alloyed. Since the base layer is typically very thin (approximately 600 Å), it is difficult to alloy the contacts such that metal 27 extends into the base layer 20 without also extending into the underlying collector layer 28. A structure that relies on such alloyed contacts suffers from process uncertainty and has been shown to be unreliable in production. The present invention is intended to address the reliability problems of this prior art structure and the process limitations of the ledge structure.

SUMMARY OF THE INVENTION

The invention includes a passivating layer of material in the base structure of an HBT that serves to cover the extrinsic base region of the transistor. The passivating layer is formed of a material having a wider bandgap than the base layer, and is heavily doped with the same doping type (n or p) as the base layer. This has advantages in that the base contacts of the device are made directly to the passivating layer and are not in direct contact with the base layer or the emitter layer. This eliminates the need for alloyed contacts and the concomitant reliability problems associated with spiking contacts. In addition, this is completely compatible with self-aligned production techniques, and can result in small self-aligned devices that have substantially the same current gain as very large devices not produced by self-alignment.

DETAILED DESCRIPTION OF PREFERRED EMBODIMENTS

Figure 4:
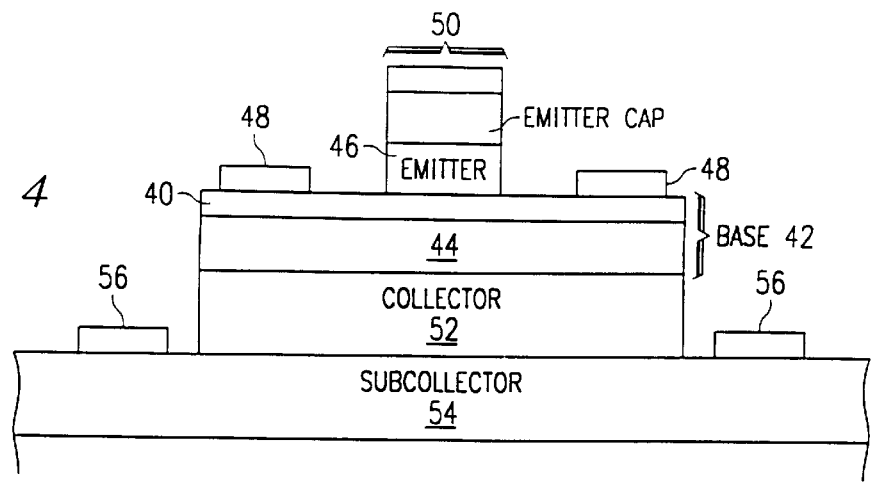
FIG. 4 is a cross-sectional view of a preferred embodiment of the invention.
Figure 5A:
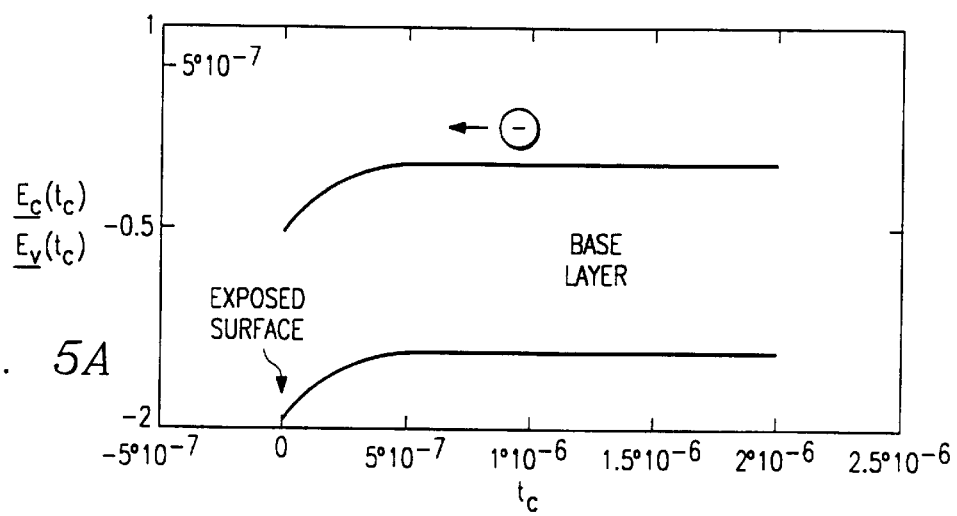
FIG. 5a is an energy band diagram showing the conduction and valence bands of an extrinsic base region of a prior art unpassivated HBT.
Figure 5B:
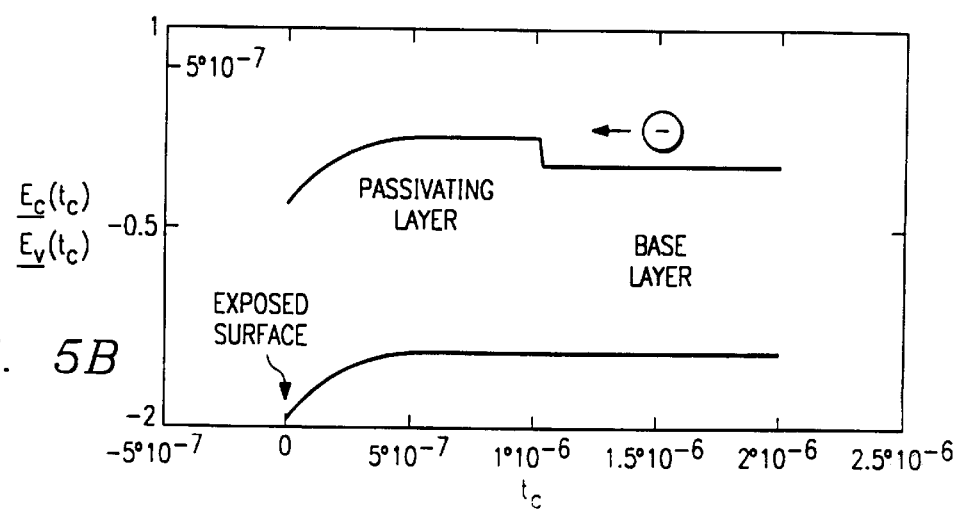
FIG. 5b is an energy band diagram showing the conduction and valence bands of an extrinsic base region with a surface passivation consisting of a wide bandgap material.

In a first preferred embodiment shown in FIG. 4, a thin AlGaAs passivation layer 40 is included within the base structure 42 of an npn HBT adjacent to the emitter layer 46. Passivation layer 40 suppresses the recombination of electrons from the emitter at the surface of the base layer surrounding the emitter mesa 50. FIG. 5a shows the effect of surface states on the conduction and valence bands of an exposed base layer without a passivation layer. Electrons entering the base layer from the emitter are drawn to the surface of the base layer because of the electric field established by the presence of surface states. This is reflected in FIG. 5a by the band bending. FIG. 5b shows the band diagram of the preferred embodiment base layer with an overlying passivation layer. It is apparent from this diagram that electrons in the base layer will be inhibited from reaching the high density of carrier traps at the surface by the conduction band discontinuity between the base layer and the exposed surface. The discontinuity is a result of the interface between the wider bandgap passivation layer 40 and the narrower bandgap base layer 44. This is not true in FIG. 5a, where there is nothing between electrons in the base and the high density of carrier traps at the surface of the base.

Figure 6:
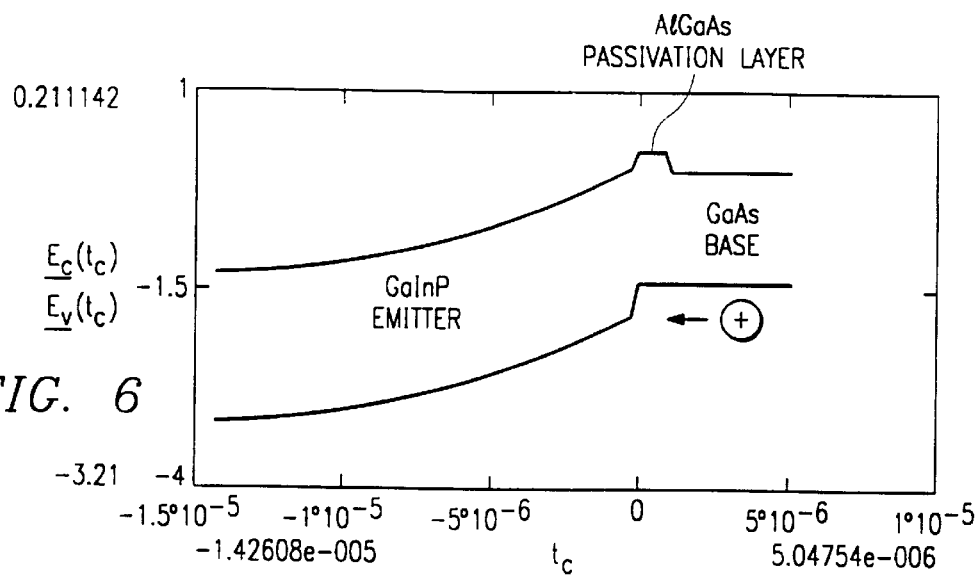
FIG. 6 is an energy band diagram showing the emitter-base heterojunction.

The band diagrams of FIGS. 5a and 5b refer to the effect of the preferred embodiment passivation layer 40 over the portion of the base layer that lies between the base contact (48 in FIG. 4) and the emitter mesa 50. It is also important that the passivation layer 40 not interfere with the functioning of the emitter-base junction, which is critical to the operation of the transistor. It is an essential aspect of the functioning of an HBT that the emitter bandgap is larger than that of the base in order to create a barrier in the valence band at the interface between the emitter and base. This barrier prevents holes injected into the base from an external source from being injected into the emitter. A band diagram illustrating this point is shown in FIG. 6. In FIG. 6 a GaAs base and $Ga_{0.52}In_{0.48}P$ emitter are separated by an $Al_{0.17}Ga_{0.83}As$ passivation layer. Note that the valence band has the necessary offset and that the discontinuity in the conduction band may easily be overcome by electrons when the emitter-base junction is forward-biased. The choice of aluminum mole fraction is important in achieving the simultaneous goals of passivating the exposed, or extrinsic, base and of providing a functional emitter-base junction. The aluminum mole fraction that fulfills these requirements is typically in the range of approximately 4% to 30%, with approximately 17% being preferable.

The doping of the AlGaAs layer 40 is of the same type (n or p) as that of the GaAs base layer 44. The carrier concentration in the passivating layer varies according to the desired performance of the transistor, but will typically be within the range from approximately $5 \times 10^{18}$ cm$^{-3}$ to approximately $1 \times 10^{20}$ cm$^{-3}$. For transistors requiring base doping below approximately $5 \times 10^{18}$ cm$^{-3}$, recombination is generally not a dominant problem, but for higher concentrations it is more critical. In order for the passivation to be effective, it is important that the entire thickness of the passivation layer not be depleted of carriers. Therefore, the choice of layer thickness depends directly upon the doping concentration in the passivation layer, which in turn is dependent upon the desired operating frequency of the transistor. For example, for L-band operation the preferred concentration is approximately $1.5 \times 10^{19}$ cm$^{-3}$; for X-band operation the preferred concentration is approximately $4 \times 10^{19}$ cm$^{-3}$; for K-band operation the preferred concentration is approximately $7 \times 10^{19}$ cm$^{-3}$. The surface depletion region depth varies in approximate proportion to the square root of the doping concentration. Thus, the depletion thickness ranges from approximately 85 Å to approximately 20 Å over the doping concentration range of $55 \times 10^{18}$ cm$^{-3}$ to $1 \times 10^{20}$ cm$^{-3}$. To ensure that the passivation layer is not completely depleted, the layer thickness is typically chosen to be in the range of 50 to 300 Å, with the particular thickness being determined by the base doping. For an X-band transistor the passivation layer thickness is approximately 100 Å, and is roughly twice the thickness of the depletion region.

Figure 3:
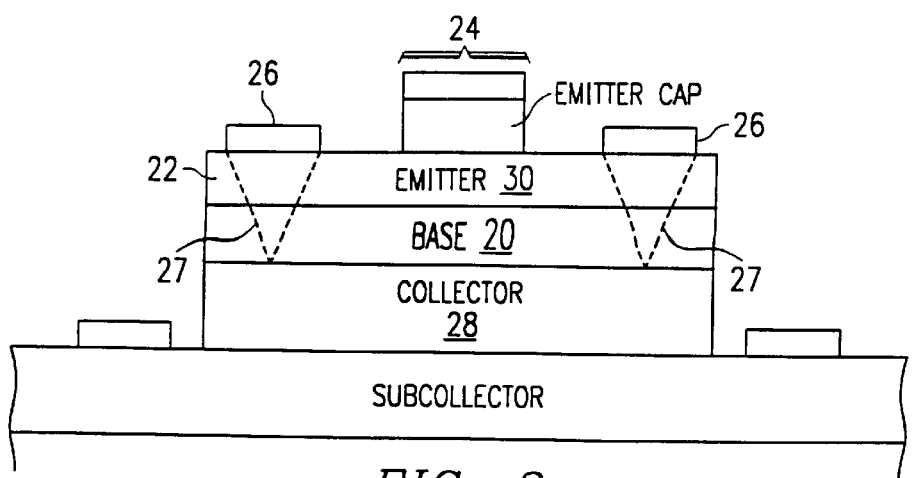
FIG. 3 is a cross-sectional view of a prior art heterojunction bipolar transistor which uses a thin emitter layer to passivate the extrinsic base.

The first embodiment structure has numerous advantages over the prior art devices. For example, in the prior art device shown in FIG. 3, the emitter layer 30 extends from the emitter mesa out underneath the base contacts 26. The emitter layer is thin enough to be depleted, but it has been shown that such a structure establishes a leakage path between the emitter mesa and the base contacts. Electrons injected laterally into the depleted surface layer travel a very short distance before recombining at the base contacts 26. Typically, such a layer will allow leakage of several milliamps before the base-emitter junction becomes forward biased. This results in a reduction of current gain.

Additionally, in order for the base contacts 26 to make contact with the base layer 20, the contact must be alloyed. Aside from the difficulties involved in stopping the contact from spiking through the base layer and into the collector 28, the metal that enters the base in the alloying procedure creates an interface that introduces carrier traps. Metal that extends into the collector forms a Schottky diode between the base and collector. This increases the emitter-collector offset voltage, which is undesirable for power amplifier applications. Any disturbance of the semiconductor lattice in the base layer, whether it is an exposed surface, or a metal contact, creates a high density of mid-bandgap states that increases the amount of undesirable recombination in the base layer. So, while the prior art minimizes the carrier traps at the base layer surface by providing an overlying depleted emitter layer, it essentially counters that advantage by introducing traps at the base contact-to-base layer interface. It has been estimated that the surface passivation provides two or three orders of magnitude improvement on the recombination velocity in the base layer, but that the introduction of alloyed metal contacts to the base layer reduces that improvement to less than one order of magnitude.

The first preferred embodiment of the invention shown in FIG. 4 retains the advantages of surface passivation, while eliminating the need for alloyed contacts to the base. Forming the passivation layer of a material doped with the same type (n or p) of dopant as the base layer, rather than that of the emitter, allows the base contact to be made directly to the passivation layer. There is no need for alloying the base contact. This eliminates the leakage path between the emitter mesa and the base contact that plagues the prior art device, while retaining the full benefit of the reduction in base layer recombination.

Figure 1:
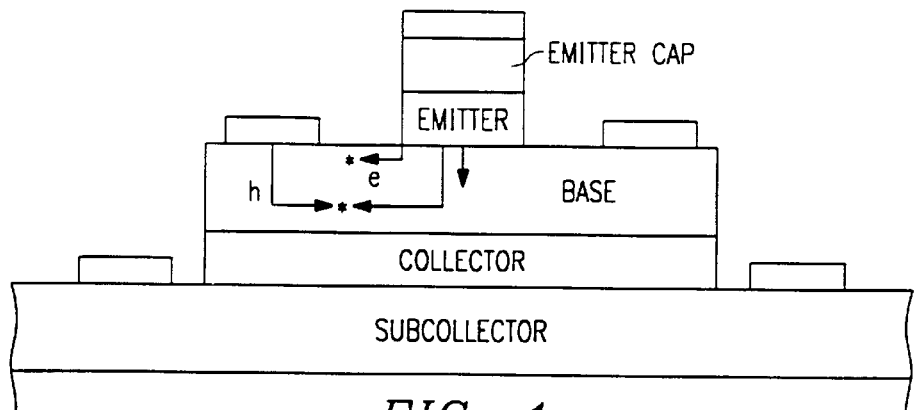
FIG. 1 is a cross-sectional view of a prior art heterojunction bipolar transistor.
Figure 2:
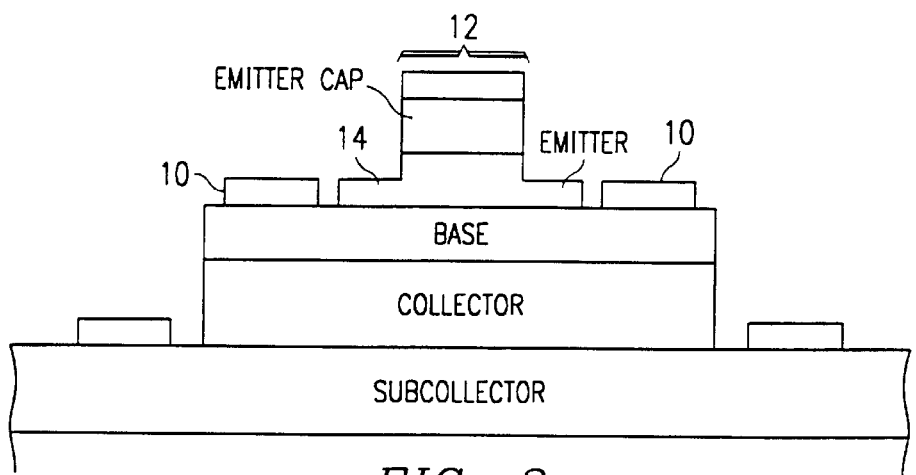
FIG. 2 is a cross-sectional view of a prior art heterojunction bipolar transistor which incorporates ledge passivation.

In a second preferred embodiment of the invention, an $Al_{0.35}Ga_{0.65}As$ emitter is used instead of the GaInP used in the first preferred embodiment. The 35% mole fraction of aluminum provides an emitter layer with a wider bandgap than the 17% aluminum passivation layer. Therefore, the band diagram of the second preferred embodiment structure is almost identical to that for the first preferred embodiment structure shown in FIG. 6. A difference between the two emitter materials is the processing involved in forming the emitter mesa shown in FIG. 4. It should be noted that the invention described with reference to these embodiments is completely compatible with self-aligned processes. This is in contrast to the prior art ledge passivation technique (FIG. 2) which requires a considerable space between the emitter mesa 12 and the base contacts 10, and other prior art techniques which suffer from high emitter-base leakage current if self-alignment is used.

Figure 7:
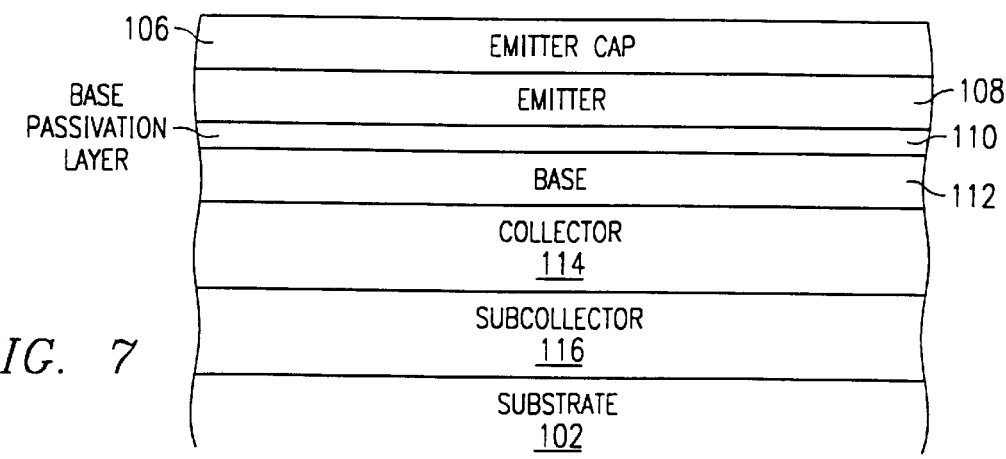
FIG. 7 is a cross-sectional diagram of a preferred embodiment material structure from which a preferred embodiment of the invention may be fabricated.
Figure 8:
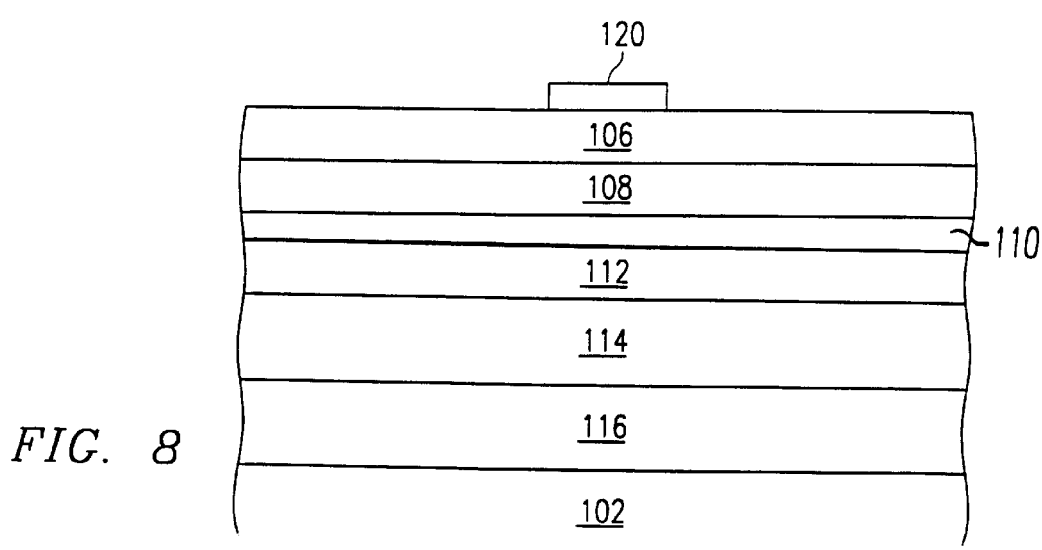
FIGS. 8–13 are diagrams showing a preferred embodiment method of processing.

A process to fabricate the first preferred embodiment may begin with the structure shown in FIG. 7 and fully described in Tables I and II. The commonly used etchants for GaAs and AlGaAs do not etch GaInP. Therefore, the processes described hereinbelow have been developed to take advantage of this selectivity. In the first approach, an emitter contact 120 of a suitable material (e.g. Ti/Pt/Au in respective thicknesses of 300/250/3000 Angstroms, for example) is deposited on GaAs layer 106, as shown in FIG. 8. The entire structure is then placed in the reaction chamber of a Reactive Ion Etching (RIE) apparatus. With $BCl_3+SF_6$, $CCl_4$, or other commonly used chlorofluorocarbons as the reactant, GaAs layer 106 is anisotropicaly dry-etched from areas not covered by masking pattern 120. The etch is allowed to continue for approximately 1 minute after the GaInP layer 108 is exposed.

Figure 9:
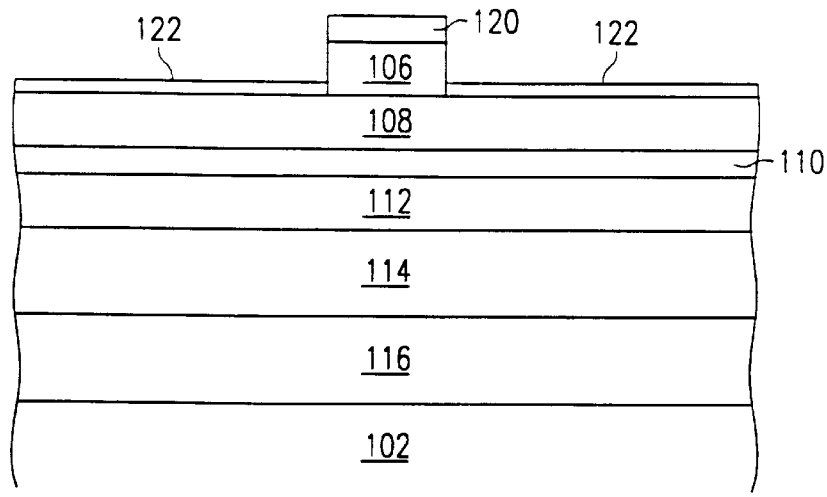

The GaInP is not etched because a residual layer of unknown composition 122, shown in FIG. 9, forms at the surface of GaInP layer 108. Thus, $BCl_3$ is an etchant that selectively etches GaAs, but not GaInP. Unfortunately, the residual layer 122 is not easily etched using the compositions known to wet etch GaInP, particularly HCl and $HCl:H_3PO_4$ (3:1 by volume).

Figure 10:
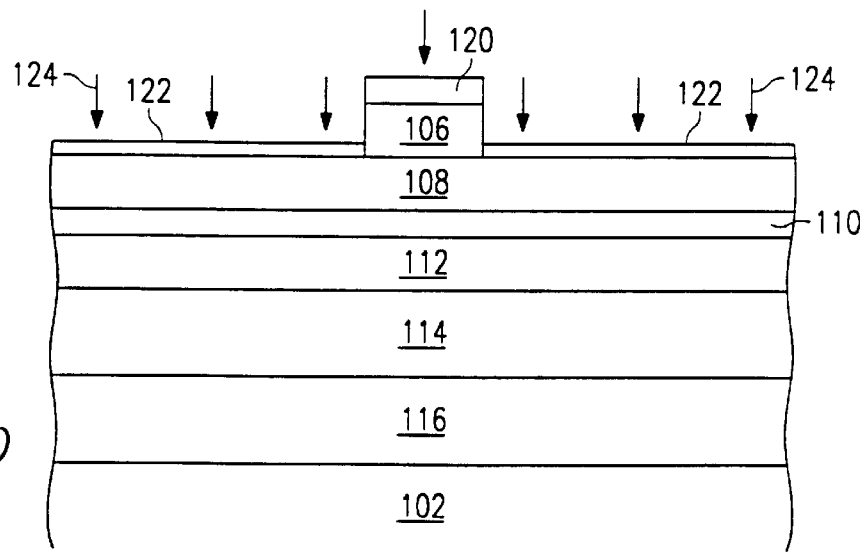
Figure 11:
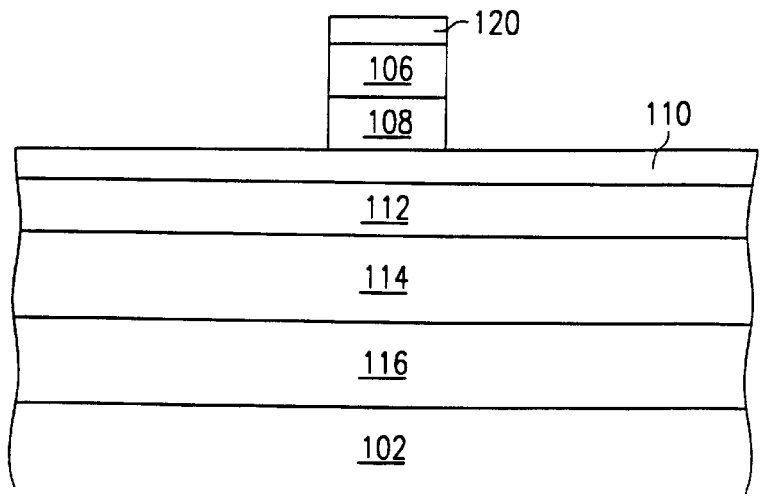
Figure 12:
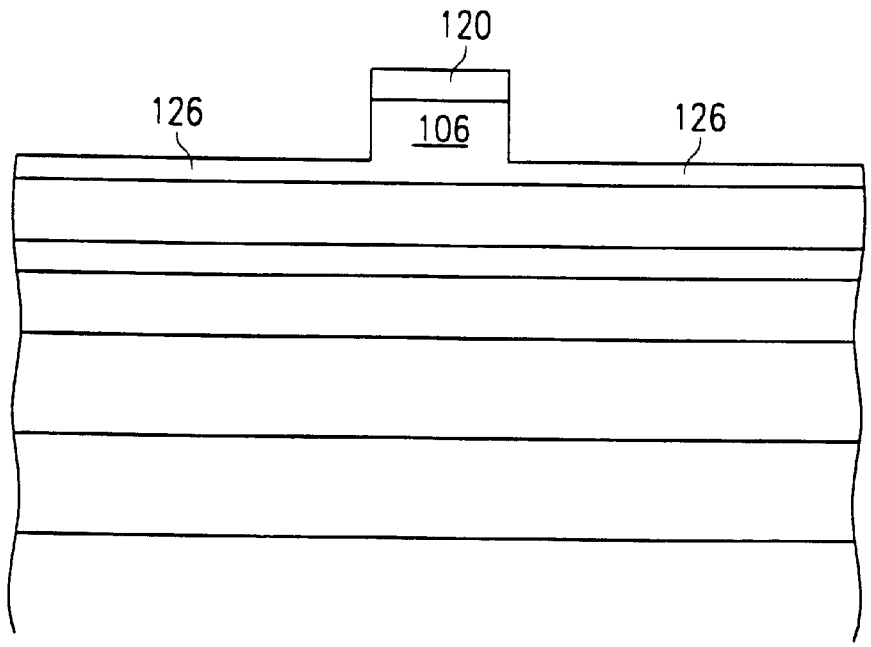

Thus, the $BCl_3$ apparently reacts with the GaInP to form a composition which is not readily etchable by either normal GaInP wet etchants or by the normal GaAs dry etchant. Therefore, in this embodiment the residual layer 122 is ion milled by placing the structure in an asher at approximately 300 Watts for approximately 10 minutes. $O_2$ and Ar 124 form the active species for the milling, depicted in FIG. 10. One can also use a commercially available ion mill apparatus. Immediately after ion milling, the structure is immersed in a solution containing HF and $NH_4F$ for approximately 1 minute. The structure is then immersed in a solution of $H_2SO_4:H_2O_2:H_2O$ (1:8:160 by volume) for 10 seconds. This prepares the GaInP for removal with an HCl solution. The structure is then immersed in static (unstirred) HCl for 5 seconds, and then immersed in a stirred HCl solution for approximately 1 minute intervals. After each interval two probes are placed on the etched surface to test for breakdown voltage. The process typically requires two 1 minute intervals to etch through the GaInP and results in a structure as shown in FIG. 11. Thus, this process combines the anisotropic, yet selective, reactive ion etching technique with the unselective ion milling and wet etch techniques. This allows the formation of an emitter having a smaller size than would be possible with a wet etch alone.

TABLE I

| Element # | Generic Name | Preferred Material | Approximate Thicknesses |
|---|---|---|---|
| 106 | Emitter Cap | GrAs | 2000 Å |
| 108 | Emitter | GrInP | 700 Å |
| 110 | Passivation layer | AlGaAs | 100 Å |
| 112 | Base | GrAs | 800 Å |
| 114 | Collector | GrAs | 7000 Å |
| 116 | Subcollector | GrAs | 1 μm |

TABLE II

| Element # | Generic Name | Approximate Doping Concentration | Preferred Dopant | Examples of Alternative Dopants |
|---|---|---|---|---|
| 106 | Emitter Cap | $1 \times 10^{19}$ cm$^{-3}$ | Si | Sn |
| 108 | Emitter | $5 \times 10^{17}$ cm$^{-3}$ | Si | Sn |
| 110 | Passivation layer | $3 \times 10^{19}$ cm$^{-3}$ | C | Be |
| 112 | Base | $3 \times 10^{19}$ cm$^{-3}$ | C | Be |
| 114 | Collector | $3 \times 10^{16}$ cm$^{-3}$ | Si | Sn |
| 116 | Subcollector | $2 \times 10^{18}$ cm$^{-3}$ | Si | Sn |

Once the emitter mesa (50 in FIG. 4) is formed, base contacts 48 may be formed by spinning on and patterning a layer of photoresist (not shown) to define the location of the contacts on the base passivation layer 40. A metal composition such as Ti/Pt/Au, for example in thickness of approximately 500, 250, and 1500 Angstroms, respectively is deposited. The photoresist is then lifted off to leave the base contacts 48 as shown in FIG. 4. Unlike the prior art structure shown in FIG. 3, the first preferred embodiment structure of FIG. 4 does not require alloying of the base contacts 48. The passivation layer 40 is a part of the base structure, rather than the emitter as in the prior art.

After the base contacts are formed, the base mesa may be formed by removing layers 40, 42, 44, and the collector layer 52 to expose the subcollector layer 54. A solution of $H_2SO_4:H_2O_2:H_2O$ in the ratio of 1:8:160 (by volume), for example, may be used to remove the layers. Photoresist (not shown) is then deposited and patterned to define the collector contacts 56. AuGe/Ni/Au is then evaporated onto the wafer to thicknesses of, for example, 500/140/2000 Angstroms, respectively, to form the contact 56. The photoresist layer is then stripped, which lifts off all excess metallization. This results in the structure of FIG. 4. The structure is then heated to 430° C. for approximately 1 minute to alloy the collector contacts.

Figure 13:
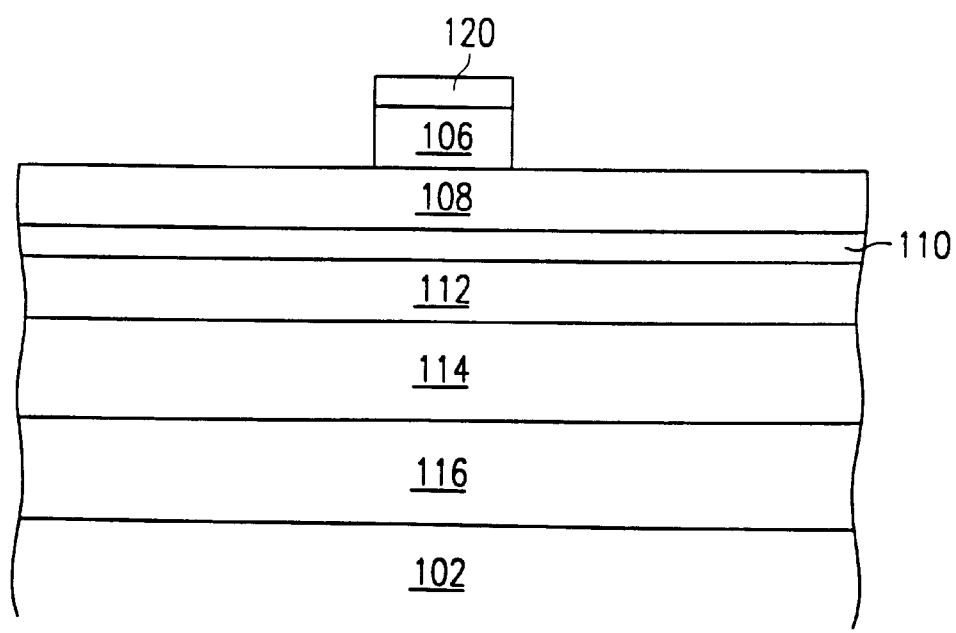

In a second preferred embodiment process, the structure of FIG. 8 is again etched using the RIE technique described above, but the etch is stopped before GaAs layer 106 is completely etched away. This leaves a thin layer 126 of GaAs, as shown in FIG. 11 (instead of forming the residual layer 122 of FIG. 9). This thin layer of GaAs is removed using a solution of $H_2SO_4:H_2O_2:H_2O$ (1:8:160 by volume). The $H_2SO_4$ solution stops on the GaInP layer 108, leaving the structure shown in FIG. 13.

Figure 14:
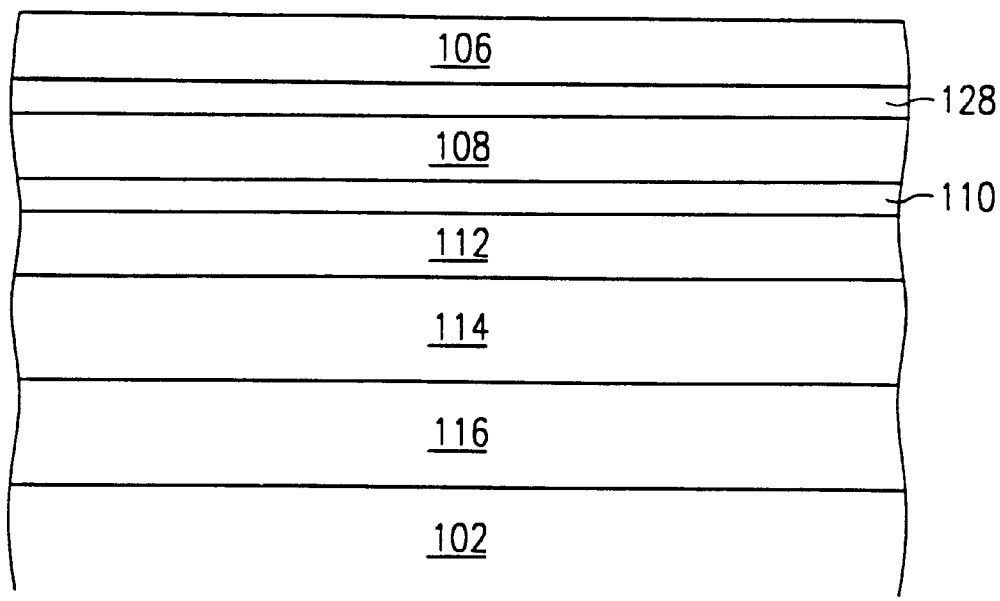
FIGS. 14 and 15 are diagrams showing a second preferred embodiment method of processing.
Figure 15:
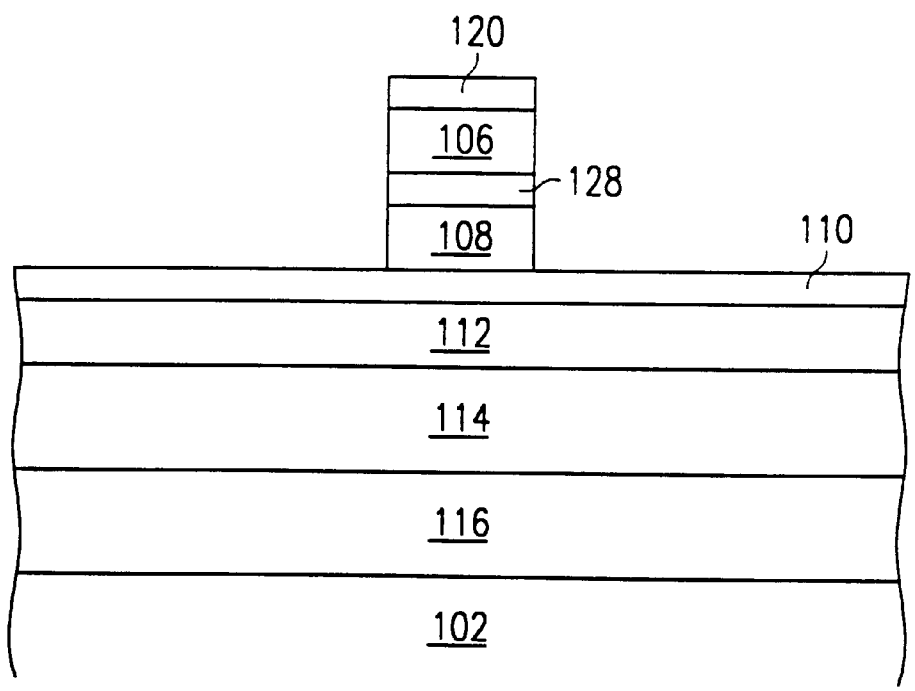

In another preferred embodiment process of the invention, the material structure is altered to include an $Al_xGa_{1-x}As$ (where x is approximately 0.3) layer 128 between GaInP layer 108 and GaAs layer 106. The structure shown in FIG. 14. The AlGaAs layer serves as an etch stop in that the $BCl_3$ dry etch described in the abovementioned embodiments, when combined with $SF_6$, for example, stops on AlGaAs. Hence, after deposition of a masking pattern 120, shown in FIG. 15, the dry $BCl_3$ etch is performed until GaAs layer 106 is removed. AlGaAs layer 128 is removed with a solution of $H_2SO_4:H_2O_2:H_2O$ (1:8:160 by volume) for example, in a timed etch. GaInP layer 108 is then removed with $HCl:H_3PO_4$ (3:1 by volume) for example. Though 3:1 does not appreciably etch the AlGaAs base layer 110, the timing in this etch is monitored to avoid substantial undercutting. The structure shown in FIG. 15 results from this process.

Yet another preferred embodiment process is similar to the first except that an InGaAs layer is deposited (by MBE, MOCVD, or other suitable technique) on GaAs layer 106. The InGaAs layer facilitates the formation of an ohmic contact to the material structure. A transistor otherwise may be formed with the process described as the first preferred embodiment. In general, the transistor of FIG. 4 may be obtained with standard processing techniques after one of the above described processes is performed.

A few preferred embodiments have been described in detail hereinabove. It is to be understood that the scope of the invention also comprehends embodiments different from those described, yet within the scope of the claims.

Internal and external connections can be ohmic, capacitive, inductive, direct or indirect, via intervening circuits or otherwise. Implementations is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, though AlGaAs was used as the wide bandgap passivation layer in the above embodiments, it may be appreciated that other materials having a bandgap wider than the layer being passivated in addition to having a lattice constant relatively close to the layer being passivated may be used. Also, though only GaInP and AlGaAs were mentioned above as emitter materials, it may be appreciated that other semiconductors producing an offset in the valence band between the emitter and base layers may be used. It is therefore intended that the appended claims encompass any such modifications or embodiments.

What is claimed is:

1. A method of fabricating a bipolar transistor, comprising the steps of:

providing a material structure including an emitter layer abutting a base structure, wherein said base structure comprises first and second layers of semiconductor having the same doping type and approximately the same doping concentration, said first layer having a wider bandgap than said second layer;

removing portions of said emitter layer to leave an emitter mesa on said base structure; and forming base contact metallization on said first layer of semiconductor.

2. The method of claim 1 wherein said first layer comprises AlGaAs and said second layer comprises GaAs.

3. The method of claim 1 wherein said emitter layer comprises GaInP and said step of removing portions of said emitter layer comprises removing said GaInP with a wet etch comprising HCl.

4. The method of claim 1 wherein said step of forming base contact metallization does not form a contact to said second layer of semiconductor.

5. A method of fabricating a bipolar transistor comprising the steps of:

providing a material structure including a GaInP emitter layer abutting a base structure, wherein said base structure comprises first and second layers of semiconductor having the same doping type and approximately the same doping concentration, said first layer having a wider bandgap than said second layer;

removing portions of said emitter layer to leave an emitter mesa on said base structure; and forming base contact metallization on said first layer of semiconductor.

6. The method of claim 5, wherein said first layer of semiconductor comprises AlGaAs, and said second layer of semiconductor comprises GaAs.

7. The method of claim 5, wherein said step of removing portions of said emitter layer comprises removing said GaInP with a wet etch comprising HCl.

* * * * *